United States Patent

Kemmler et al.

[11] Patent Number: 6,119,515
[45] Date of Patent: Sep. 19, 2000

[54] METHOD AND APPARATUS FOR MONITORING ACTUATORS

[75] Inventors: Lothar Kemmler, Moerfelden-Walldorf; Peter Opl, Dietzenbach, both of Germany

[73] Assignee: Samson Aktiengesellschaft, Frankfurt am Main, Germany

[21] Appl. No.: 08/955,073

[22] Filed: Oct. 21, 1997

[30] Foreign Application Priority Data

Oct. 21, 1996 [DE] Germany .................... 196 43 297

[51] Int. Cl.⁷ .................... G01M 19/00; G01N 3/56
[52] U.S. Cl. ............................ 73/168; 73/9
[58] Field of Search ............ 73/9, 168; 137/552.7; 702/114

[56] References Cited

U.S. PATENT DOCUMENTS

| | | | |
|---|---|---|---|
| 4,274,438 | 6/1981 | LaCoste | 137/551 |
| 4,523,286 | 6/1985 | Koga et al. | 73/9 X |
| 4,976,144 | 12/1990 | Fitzgerald | 73/168 |
| 4,993,259 | 2/1991 | LaFountain | 73/168 |
| 5,329,956 | 7/1994 | Marriott et al. | 73/168 X |
| 5,492,009 | 2/1996 | Kempf et al. | 73/168 |
| 5,549,137 | 8/1996 | Lenz et al. | 137/486 |

FOREIGN PATENT DOCUMENTS 44 19 548  12/1995  Germany .

*Primary Examiner*—Hezron Williams
*Assistant Examiner*—Willie Morris Worth
*Attorney, Agent, or Firm*—Hill & Simpson

[57] ABSTRACT

A method and apparatus for operational monitoring of an actuator, which has a drive force unit that requires a characteristic time for build-up of the force, the apparatus including at least one position signal generator detecting a rest position of the actuator, a drive switch unit for actuating the drive force unit, and signal connections to an analyzing arrangement having a memory and a comparison unit so that, during operation, the time difference between the actuation of the drive switch unit and the possible response of the position signal generator allocated to the preceding rest limit position of the actuator is monitored, a comparison of the measured quantity to characteristic data deposited in the memory is implemented and a conclusion about the condition of the actuator is obtained from this analyzation.

17 Claims, 1 Drawing Sheet

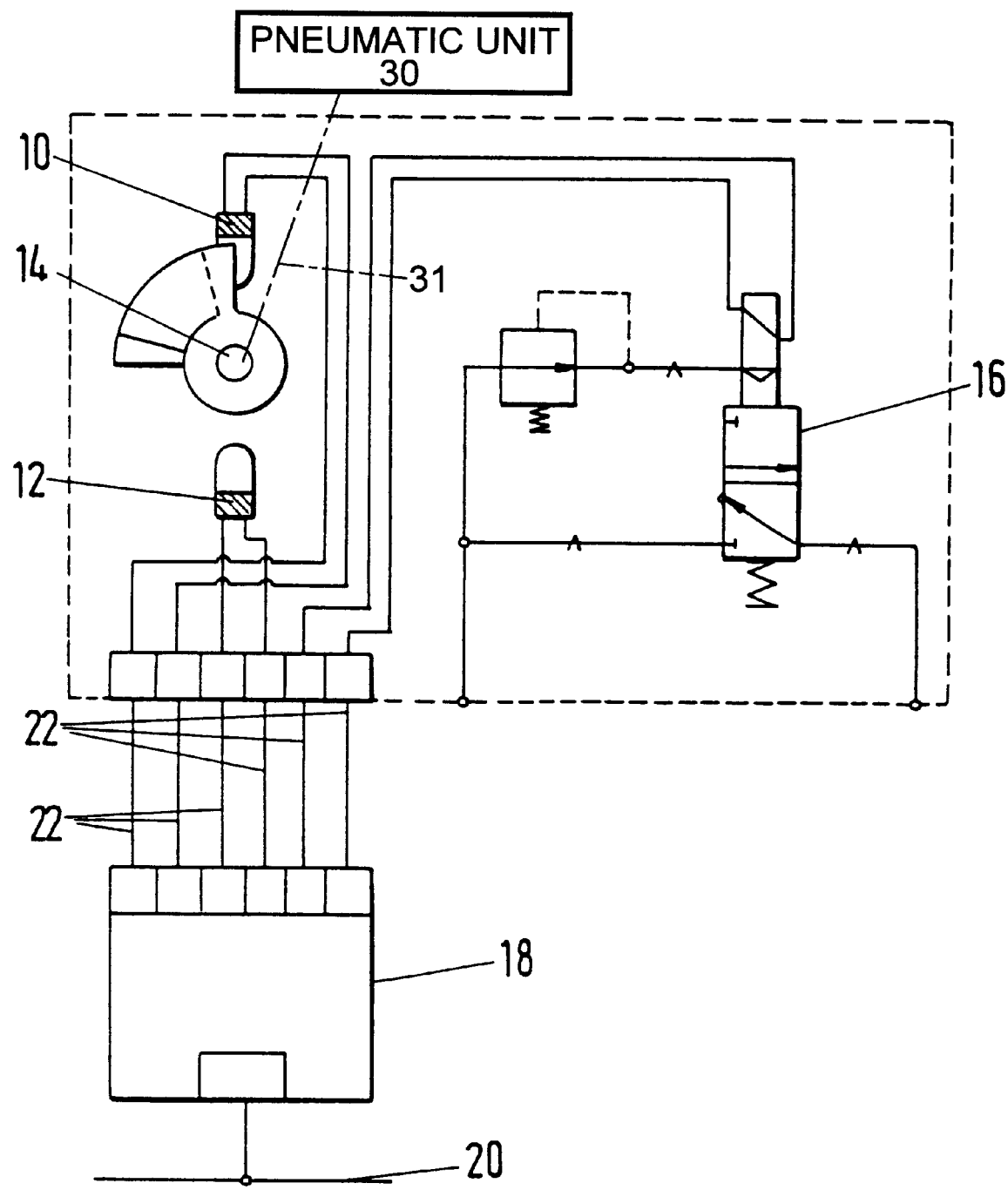

METHOD AND APPARATUS FOR MONITORING ACTUATORS

BACKGROUND OF THE INVENTION

The present invention is directed to a method and apparatus for operational monitoring of an actuator, which apparatus includes a drive force unit that requires a characteristic time for building up the force to cause movement of the actuator, at least one position signal generator detecting a rest position of the actuator, a drive switch unit for actuating the drive force unit, and a signal connection to an analyzing means having a memory and a comparison unit.

When utilizing actuators, it is necessary, partly for safety-oriented reasons, or important for economic reasons, to monitor the functionability of the actuator in order to be able to make necessary repairs in time. For example, incorrectly tightened or worn seals, which may be in snuffing boxes, or broken drive spindles can represent sources of error. New possibilities of monitoring these sources of error occur due to the increasing spread of field bus systems.

A number of proposals for monitoring actuators are already known in conjunction with actuator devices for control and with position regulators utilized with them. These proposals are essentially based on measuring the position of the actuator relative to the drive spindle, dependent on the time and the control pressure or, respectively, flow and comparing this to, for example, initialization data.

U.S. Pat. No. 5,549,137, whose disclosure is incorporated herein by reference thereto and which was the basis for WO 95/06276, discloses a position regulator with sensor mechanism for determining the position of the actuator and for measuring the control pressure, wherein a control device is provided that generates a control signal dependent on the rated value of the actuator position, on the measured quantities and time derivations thereof. This patent mentions numerous possibilities for improving the control algorithm. These possibilities are based on what is known as characteristics which are stored, particularly for the flow, and a dynamic correction of the output values or, respectively, the output of error messages as well and which characteristics are the basis of the comparison to current values. The sensor mechanism generally required for measuring the control pressure, is complicated and expensive. This is particularly true of actuators with an open/close characteristic.

German Published Application 44 19 548 discloses another method for monitoring an actuator for control having an electro-pneumatic position regulator. It is proposed therein to superimpose a variable-amplitude test signal on the control pressure and to draw conclusions about the condition of the actuator from the relationship between the test signal and the movement of the system to be controlled. The hysteresis determined according to this method by superimposition of a test signal, by contrast, is not a meaningful quantity for actuators with an open/close characteristic. Since the control pressure for actuators with the open/close characteristic only assumes two conditions, it is not possible to superimpose a variable-amplitude test signal on this device.

By comparison, proposals for monitoring actuators with the open/close characteristic are hitherto unknown. The different demands and conditions of use require new methods for monitoring that cannot be transferred from regulating control devices. An additional difficulty is based on the fact that many actuators with the open/close characteristic are utilized as safety-relevant actuators and an opening or, respectively, closing thus only occurs during an emergency.

On the basis of the principle, thus, the movement of the drive spindle occurring during normal operation given regulating control devices is not suitable as a measured quantity for monitoring such actuators.

SUMMARY OF THE INVENTION

The present invention is based on the object of realizing a method and apparatus for monitoring an actuator which has a drive force unit which requires a characteristic time for building up the force, at least one position signal generator detecting a rest position of the actuator, a drive switch unit for operating the drive force unit and a signal connection to an analysis means having a memory and a comparison unit, which method and apparatus can be used both for actuators with an open/close characteristic as well as for actuators for regulation, managed without additional sensor mechanisms and are, thus, especially simple and cost-beneficial to manufacture.

The method includes, during operation, monitoring the time difference between the actuation of the drive switch unit and the possible response of the position signal generator allocated to the preceding rest limit position of the actuator, comparing the measured quantity to the characteristic data, which has been stored in a memory, and obtaining a conclusion concerning the condition of the actuator from this comparison.

It can therefore be provided that the breakaway time is identified in that the drive switch unit is activated and then deactivated after a response of the position signal generator allocated to the preceding rest position of the actuator and that the time that thereby elapsed between the actuation of the drive switch unit and the response of the position signal generator is measured.

The invention also provides that the drive switch unit is activated and deactivated with chronologically well-defined pulse lengths, whereby both the correct response as well as the non-response is monitored dependent on the pulse of the drive.

It can also be provided that the breakaway time is identified by a systematic variation of the pulse length, wherein the pulse length can be varied both from the shorter time interval to a longer time interval until an initial response of the position signal generator is obtained for the initial direction as well as in the opposite direction.

The invention also provides that the characteristic data deposited in the memory are determined and deposited in an initialization run of the device.

It is also provided that the time difference identified during operation is compared to rated values determined from the initialization run, and an error message is generated given downward or, respectively, upward transgression of the predetermined time value.

The invention also proposes that the appertaining drive signal is used as a switching time of the drive switch unit and that the next switching pulse edge in a signal of a position sensor generator to occur is employed as point in time of the response of the position signal generator.

It can also be provided that, as a function test, the drive switch unit is cyclically activated until the response of the chronologically closest position signal is obtained and is then switched back into the preceding condition before the other limit position is reached.

The invention also provides that the movements of the actuator are counted and an alarm message is output given an upward transgression of a predetermined limit value.

In the apparatus category, the above-recited object is achieved in an improvement of the apparatus for monitoring a drive force unit that requires a characteristic time for building up the force and which apparatus has at least one position generator detecting a rest position of the actuator, a drive switch unit for actuating the drive force unit, and a signal connection to an analyzing means having a memory and means for comparing. The improvement is that the measured quantities are applied to the means for comparing or the comparison unit, which is supplied with time differences which are obtained during operation between the activation of the drive switch unit and the possible response of the position signal generator allocated to the preceding rest position of the actuator and that the comparison unit is configured for comparing a measured quantity to a characteristic data deposited in the memory and in that the condition of the actuator can be determined from this analyzation.

It can therefore be provided that the drive force unit works pneumatically. In addition, the invention also proposes that the drive switch unit is a solenoid valve. It can also be provided that the comparison unit comprises a microprocessor.

It is also proposed that two limit signal generators for respectively detecting one limit position are utilized as position signal generators.

The invention also proposes that the allocation of the limit signal generators to specific positions of the actuator are defined and the limit signal generators are mounted according to their defined positions. It can also be provided that the signal connections are designed as a field bus system.

The invention also provides that more than two signal generators or an analog position reporter are provided.

It can also be provided that the setting of the limit values can be undertaken via the field bus.

Finally, the invention also provides that an error signal can be generated when the closing point is fallen below.

It is also proposed that a microprocessor is present and recognizes the rest position of the actuator and thus initiates the inventive method. It is also proposed that the device be fashioned as part of a position regulator.

The invention is based on the surprising perception that, in particular, the "breakaway time", i.e., the time between the activation of the drive force unit and the onset of the actuator movement, is sensitively influenced when, for example, the friction of the drive spindle seals change. It additionally turns out that no further sensors are needed in order, based on this concept, to realize a monitoring method in the way provided by this invention.

In the implementation of the inventive method or, respectively, given the apparatus of the invention, of course, both excessively short as well as excessively long breakaway times, i.e., thus, the limit switch generator may possibly not respond at all, will indicate a correct or, respectively, faulty function of the actuator.

The determination of the time difference characterizing the functionability can be undertaken according to the inventive method either in that the drive switch unit is activated, is deactivated after response of the position signal generator allocated to the preceding rest position of the actuator and that the time difference between the actuating of the drive and the response of the position signal generator is determined, or in that the drive switch unit is activated and deactivated with chronologically well-defined pulse lengths, wherein both the correct response as well as the non-response is monitored dependent on the pulse length of the actuation or the breakaway time can be identified by a systematic variation of the pulse length.

The characterizing time difference can be vividly imagined as "breakaway time" and, with a given drive force unit, is essentially determined by the adhesive friction of the drive spindle. By contrast thereto, measurements of running times relate mainly to the sliding friction that occurs.

The determination of the characteristic data and the storing can occur in an initial initialization run. The limit values allowed for the correct functioning can thereby be preset or subsequently input.

By comparing the identified time difference for the appertaining rated value, not only can a confirmation of the correct functioning or an error message be generated but, in the fashion of an expert system, assistance can be output for error diagnosis when the direction of the deviation and, possibly, its size as well are acquired. Possible indications of cause of error could, for example, contain the following particulars. When the friction is elevated, this may be caused by the drive seal either being too tightly tightened; the auxiliary energy is too low; a broken drive spindle; a broken spring; a connection of the drive is deflected or the actuator is blocked. When the friction is lowered, either the drive spindle may be worn or the auxiliary energy may be too high.

This monitoring method can be realized in an especially beneficial way when the signal connections are realized via signal lines and the analysis unit, the memory unit and the comparison unit are separated from the actuator by these signal lines. According to the method, the drive of the position signal generator and of the driving signals switch unit, however, can occur both analog as well as digitally. The switching times needed for the time measurements are advantageously formed by the activation signal of the drive switch unit and the next occurring switching pulse edge of the position signal generator. This method also offers a possibility of permanently monitoring the functionability of safety-relevant actuators that, for example, effect a shut-off only in an emergency.

By driving with a pulse length that is selected shorter than the rated breakaway time, in particular, a testing of the actuator that is completely without influence on the process in the normal case can be implemented. It is also provided to drive the actuator cyclically, for example one an hour, and to switch the drive switch unit back after the response of the closest or next limit value generator, so that the actuator only executes a short duration movement and does not proceed into another limited position. This short breakaway can generally also be tolerated during operation, since it usually causes no disruption in the process. The time interval for the cyclical test can be set both with defined pulse lengths as well as variable given measurements of the breakaway time.

The method also offers the possibility of counting the movement of the actuator and of outputting an alarm message given upward transgression of a predetermined or user-defined limit value. Attention can thereby be drawn early to possible errors due to wear, and the outage of the actuator can be prevented. The method can be especially advantageously applied in the case of pneumatic drive force units, since these, due to the compressibility of air, require a characteristic time for a build-up of the force. A solenoid valve is then usually employed as a drive switch unit.

Fundamentally, however, the inventive method is also employable for other drives, such as, for example, electrical drives, when, as can be realized with the spring force, there is a characteristic time delay between the drive and the build-up of the force. If this rise time is too short, the resolution of the measurement time must, of course, also be correspondingly higher.

An advantageous expansion of the method provides that the allocation of the limit signal generator to a specific limit position is defined and the assembly therefore occurs according to this definition. As a result of these definitions, an automatic recognition of the working direction and the read-in of the characteristic data in an initialization run can occur in the commissioning or beginning of the device. Errors of the adjustment or, respectively, of the attachment could also be simultaneously recognized and reported during the initialization. In a further development of the method, the signal line, which can also be implemented self-certain, makes it possible that the setting or, respectively, the fine adjustment of the limit values occurs via the signal line. It is likewise possible to employ more than two limit signal generators or an analog position reporting means. In another form of the inventive method, it is thereby easily possible that the limit values are automatically set during the initialization run.

The method can be especially advantageously realized for monitoring actuators with an open/close characteristic, since it requires no additional sensor mechanism and can, thus, be especially cost-beneficially realized. The limit signal generators (for example, inductive devices) usually employed then supply the position signal needed for the method.

The method, however, can likewise be utilized for monitoring control actuators, wherein a microprocessor, which is already utilized in many more recent types of position regulators, recognizes the rest position needed for the implementation of the method.

Other advantages and features of the invention will be readily apparent from the following description of the preferred embodiments, the drawing and claims.

BRIEF DESCRIPTION OF THE DRAWINGS

The FIGURE is an exemplary embodiment of an apparatus for the operational monitoring of an actuator with an open/close characteristic of the present invention.

DESCRIPTION OF THE PREFERRED EMBODIMENTS

The principles of the present invention are particularly useful when incorporated in an apparatus for operationally monitoring of an actuator with an open/close characteristic as shown in the FIGURE. The apparatus has a first limit switch generator 10 and a second limit switch generator 12, which are allocated to a drive spindle 14 of a drive force unit 30, which may be a pneumatic unit and is connected to spindle 14 as illustrated by the line 31. The drive force unit, which charges the drive spindle 14, is driven by an auxiliary-controlled valve switch unit or drive switch unit 16. An analysis means 18 with a memory and a comparison unit that lies at a field bus 20 is in communication via signal lines 22 with the drive switch unit 16 as well as the limit switch generators 10 and 12. The second generator 12 may be an analog position reporter instead of a limit switch and the first limit switch generator can be part of a position regulator.

During operation of the apparatus, the drive switch unit 16 is activated first, whereupon a deactivation occurs after response of the limit switch generator 10 allocated to the preceding limit position of the actuator, and the time difference between the activation and the response of the limit switch generator 10 is identified. The identified time difference is compared to the appertaining rated value with the analysis means 18, from which not only a confirmation of the correct functioning or an error measure can be obtained, but assistance can also be output for error diagnosis with both the direction of the deviation and the size of deviation being provided.

Conversely, the method can also be employed, of course, when the limit switch generator detects the opposite limit position as the rest position.

Both individually as well as arbitrary combinations of the features of the invention disclosed in the specification as well as in the claims can be obtained as various embodiments of the invention.

Although various minor modifications may be suggested by those versed in the art, it should be understood that we wish to embody within the scope of the patent granted hereon all such modifications as reasonably and properly come within the scope of our contribution to the art.

We claim:

1. A method for operational monitoring of an actuator, which has a drive force unit that requires a characteristic time for build-up of the force, at least one position signal generator detecting a rest position of the actuator, a drive switch unit for actuating the drive force unit, and switch connections from the drive switch unit and said at least one position signal generator to an analyzing means, which means has a memory and a comparison unit, said method comprising the steps of, during operation, monitoring the time difference between the actuation of the drive switch unit and receipt of a response signal of said at least one position signal generator allocated to the preceding rest position of the actuator, comparing the time difference to a characteristic data which is deposited in the memory and obtaining the condition of the actuator from the comparison.

2. A method according to claim 1, wherein the step of obtaining the condition includes identifying a breakaway time between the operation of the drive switch unit and the response signal from the position signal generator, including the steps of deactivating the drive switch unit after receipt of the response signal of the position signal generator allocated to the preceding rest position of the actuator and measuring the time that elapsed between the actuation of the drive switch and receipt of the response signal of the position signal generator.

3. A method according to claim 1, which includes activating and deactivating the drive switch unit with a signal from the analyzing means having chronologically well-defined pulse lengths and monitoring both the correct response signal as well as a non-response signal dependent on the chronologically define pulse lengths of the signal from the analyzing means.

4. A method according to claim 1 which includes identifying a breakaway time by a systematic variation of the pulse lengths of the drive switch unit activating and deactivating signal and includes varying the pulse length from a shorter to a longer time interval until an initial response signal of the position signal generator is obtained for actuator movement in both the initial direction and the opposite direction.

5. A method according to claim 1, which includes determining and depositing the characteristic data in the memory during an initialization run of the actuator.

6. A method according to claim 1, the step of comparing time difference during the operation to a rated characteristic determined from an initialization run and generating an error message if the time difference is different than a predetermined limit value.

7. A method according to claim 3 wherein the step of actuating and deactuating the drive switch unit utilizes a pulse length of an appertaining signal from the analyzing means as a switching time for the unit and a next switching edge of the response signal of the position signal generator to occur is employed as a point in time of the response signal of the position signal generator.

8. A method according to claim 1, which includes providing a function test cyclically activating and deactivating the drive switch unit until a response signal of the position signal generator is obtained and then moving the actuator back to the preceding rest position before another limit position is reached.

9. A method according to claim 8, which includes counting the movements of the actuator and providing an alarm message when a counted number exceeds a predetermined limit value.

10. An apparatus for operational monitoring of an actuator, which has a drive force unit that requires a characteristic time for building up the force, said apparatus including at least one position signal generator detecting a rest position of the actuator, a drive switch unit for actuating the drive force unit, and signal connections from said at least one position signal generator and said drive switch unit to means for analyzing, said means for analyzing including a memory and means for comparing, said means for analyzing obtaining a time difference monitored during operation between the activation of the drive switch unit and receipt of a response signal from a position signal generator allocated to the preceding rest position of the actuator, said means for comparing being configured for comparing this time difference to characteristic data deposited in the memory and the means for analyzing providing a determination of the condition of the actuator based on the output of the means for comparing.

11. An apparatus according to claim 10, wherein the drive force unit is a pneumatic unit.

12. An apparatus according to claim 11, wherein the drive switch unit is a solenoid valve.

13. An apparatus according to claim 10, wherein the means for comparing is a microprocessor.

14. An apparatus according to claim 10, which includes two signal generators each detecting one limit position being utilized as position signal generators.

15. An apparatus according to claim 14, wherein the limit signal generators are positioned to determine specific positions of the actuator and the limit signal generators are mounted according to said specific position.

16. An apparatus according to claim 10, which includes an additional device selected from a second limit signal generator and an analog position reporter for detecting a second limit position of the actuator.

17. A method according to claim 3, which includes counting the movements of the actuator and providing an alarm message when a counted number exceeds a predetermined limit value.

* * * * *